(12) United States Patent
Geissinger et al.

(10) Patent No.: US 7,388,275 B2
(45) Date of Patent: Jun. 17, 2008

(54) ELECTRONIC PACKAGE WITH INTEGRATED CAPACITOR

(75) Inventors: John D. Geissinger, Austin, TX (US);
Paul M. Harvey, Austin, TX (US);
Robert R. Kieschke, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 140 days.

(21) Appl. No.: 11/422,007

(22) Filed: Jun. 2, 2006

(65) Prior Publication Data
US 2006/0203458 A1 Sep. 14, 2006

Related U.S. Application Data

(62) Division of application No. 09/491,302, filed on Jan. 25, 2000, now Pat. No. 7,064,412.

(51) Int. Cl.
*H01L 29/93* (2006.01)

(52) U.S. Cl. ............... 257/535; 257/532; 257/595; 257/602; 257/E27.024; 257/E27.025; 257/E27.045; 257/E27.048; 257/E27.071

(58) Field of Classification Search ........ 257/296–313, 257/533, 595–602, 923, 924, E27.016–E27.017, 257/E27.019–E27.021, E27.023–E27.025, 257/E27.03–E27.035, E27.037–E27.038, 257/E27.041–E27.045, E27.047–E27.048, 257/E27.071, E27.09, E27.092–E27.093, 257/E27.095, E27.101, E27.114–E27.116
See application file for complete search history.

(56) References Cited

U.S. PATENT DOCUMENTS

| 3,780,352 | A | 12/1973 | Redwanz |
| 4,945,399 | A | 7/1990 | Brown et al. |
| 4,982,311 | A | 1/1991 | Dehanie et al. |
| 5,027,253 | A | 6/1991 | Lauffer et al. |
| 5,212,402 | A | 5/1993 | Higgins, III |
| 7,064,412 | B2 * | 6/2006 | Geissinger et al. ......... 257/535 |

FOREIGN PATENT DOCUMENTS

EP 0361495 A2 4/1990

* cited by examiner

*Primary Examiner*—Jasmine Clark
(74) *Attorney, Agent, or Firm*—Melanie G. Gover

(57) ABSTRACT

Generally provided is a circuit assembly construction for controlling impedance in an electronic package. A large scale, parallel-plate capacitor includes two electrodes separated by a dielectric material. The electrodes serve as reference voltage planes for the electronic package. At least one of the electrodes is patterned such that both electrodes are accessible from a common side of the capacitor. The capacitor is positioned with a first electrode mounted adjacent to an interconnect circuit portion of the electronic package. An electronic device portion of the electronic package is electrically connected, directly or indirectly, to one or more of the electrodes of the capacitor.

4 Claims, 4 Drawing Sheets

ELECTRONIC PACKAGE WITH INTEGRATED CAPACITOR

This application is a divisional of U.S. Ser. No. 09/491,302, filed Jan. 25, 2000, now U.S. Pat. No. 7,064,412 now allowed, the disclosure of which is herein incorporated by reference.

BACKGROUND

The invention disclosed herein relates generally to electronic packages and more specifically to an electronic package with an integrated capacitor.

Electronic packages facilitate the mounting and handling of electronic devices such as microprocessors, video controllers and memory. Tape ball grid array packages (hereinafter referred to as TBGA packages) take advantage of the fine line capability of flexible circuit technology and offer superior wiring density and wire bond solder pad density when compared to many other types of electronic package constructions. However, because of the single layer architecture in current TBGA packages, power and ground distribution capability is limited when compared with multi-layer plastic and ceramic ball grid array packages.

Capacitors are used to decouple the system-level power supply from individual electrical devices of an electronic package. Decoupling of an electronic device from the power supply reduces the overall noise in the power distribution network of the electronic package. However, due to increases in the speed and electrical current associated with high-speed electronic devices, traditional capacitor structures do not provide adequate performance because the inductance associated with these types of capacitors inhibits their operation at high speeds. Interconnect inductance in an electronic package chokes the capacitor, preventing the high-speed transfer of electrical current to and from the capacitor.

Embedding capacitors directly into the electronic packages provides significant decoupling capacitance with very low interconnect inductance. Furthermore, the electrodes of the capacitor may serve as reference voltage planes in the electronic package for providing excellent power distribution within the package. This approach facilitates very high-speed operation of electronic devices within an electronic package.

U.S. Pat. No. 4,945,399 discloses a pin grid array package having an integrated, distributed capacitor. The package includes a circuit having two metal layers with a dielectric layer between them. A first one of the metal layers includes signal traces and an electrode. A second one of the metal layer serves as a second electrode. A capacitor is formed in areas where the electrodes of the first and second metal layers overlap. Pins are situated within apertures that extend through the various layers of the circuit, including the electrodes. The area of the first metal layer of the circuit is divided between signal routing and electrode regions, limiting the capacitance of the capacitor. A pin grid array package of this construction is expensive to manufacture. Also, due to the pins breaching the electrode layers, this type of configuration reduces the available capacitance for a given size package.

U.S. Pat. No. 5,027,253 to Lauffer et al discloses a multi-layer circuit package having an embedded thin film capacitor. The package includes at least two signal cores with each one of the cores being interconnected to a corresponding electrode of the capacitor. In this manner, the signal cores are capacitively coupled to each other. The capacitor structure disclosed in this reference does not address decoupling of the power supply from a semiconductor device in the electronic package. Furthermore, because a ground core lies between the capacitor and the semiconductor device, substantially long conductive lead wires and conductive through holes extending through the power core are required to connect the semiconductor device to the electrodes. The length of these lead wires increase inductance, thereby reducing the electrical performance improvements provided by the capacitor.

The requirement of controlling the electrical characteristics of electronic packages is becoming more critical as the operating speed of electronic devices increases. The inability of an electronic package to meet the required electrical current demands of an electronic device results in noise associated with voltage drops within the electronic package. The use of capacitors in electronic packages is known in the art to ameliorate power and ground distribution noise in conventional electronic package configurations. However, prior solutions for using capacitors to reduce noise in electronic packages and prior capacitor designs have provided only limited success for use with high-speed electronic devices in electronic packages. Prior solutions are also limited in their ability to cost effectively provide a low impedance power distribution structure in TBGA cavity-down wire bond electronic packages.

Accordingly, what is needed is an circuit assembly construction that offers an economical and versatile noise reduction solution for high-speed devices of electronic packages that overcomes the shortcomings of previous solutions.

SUMMARY

The present invention generally provides a circuit assembly construction for controlling impedance in an electronic package. A large scale, parallel-plate capacitor includes two electrodes separated by a dielectric material. The electrodes serve as reference voltage planes for the electronic package. At least one of the electrodes is patterned such that both electrodes are accessible from a common side of the capacitor. The capacitor is positioned with a first electrode mounted adjacent to an interconnect circuit portion of the electronic package. An electronic device portion of the electronic package is electrically connected, directly or indirectly, to one or more of the electrodes of the capacitor.

It is preferred for only one of the two electrodes to be patterned. It is also preferred that the size and configuration of the patterned electrode minimize the reduction in the effective capacitance of the capacitor and provide for a short interconnect distance between the conductive trace layer of the circuit and the second one of the two electrodes. By maintaining a short interconnect distance, the associated inductance is reduced.

The capacitors are preferably thin-film parallel-plate type capacitors. Preferred dielectric materials for the capacitors include barium titinate, strontium titinate, and a polymer blended with high dielectric constant particles such as barium titinate, barium strontium titinate, titanium oxide, lead zirconium titinate and tantalum oxide. The capacitance of a typical thin film, parallel-plate capacitor is from about 1 nF/sq. cm. to about 100 nF/sq. cm.

The interconnect circuits are preferably tape ball grid array circuits having flexible dielectric substrate layers. Preferred dielectric substrates for the interconnect circuits include polyimide and polyester films.

In one embodiment of the present invention, an electronic package includes a conductive trace layer having a first side and a second side. The conductive trace layer is patterned to define a plurality of interconnect pads. A dielectric substrate is mounted on the first side of the conductive trace layer. A capacitor including a first conductive layer, a second conductive layer and a layer of dielectric material disposed therebetween is mounted with the first conductive layer adjacent to the second side of the conductive trace layer. A plurality of interconnect regions extend through the first conductive layer and the dielectric material layer of the capacitor. An interconnect member is connected between each one of the conductive layers of the capacitor and a corresponding set of the interconnect pads. The first conductive layer of the capacitor is electrically connected to a first set of the interconnect pads and the second conductive layer of the capacitor is electrically connected to a second set of the interconnect pads. The interconnect members corresponding to the second set of interconnect pads extend through one of the interconnect regions.

Another embodiment of the present invention provides an electronic package including a conductive trace layer having a first side and a second side. The conductive trace layer is patterned to define a plurality of interconnect pads. A flexible dielectric substrate is mounted on the first side of the conductive trace layer. A flexible capacitor including a first conductive layer, a second conductive layer and a layer of dielectric material disposed therebetween is mounted with the first conductive layer adjacent to the second side of the conductive trace layer. A plurality of interconnect regions extend through the first conductive layer and the dielectric material layer of the capacitor. An interconnect member is connected between each one of the conductive layers of the capacitor and a corresponding set of the interconnect pads. The first conductive layer of the capacitor is electrically connected to a first set of the interconnect pads and the second conductive layer of the capacitor is electrically connected to a second set of the interconnect pads. The interconnect members corresponding to the second set of interconnect pads extend through one of the interconnect regions.

An aperture extends through the dielectric substrate adjacent to each one of the interconnect pads. A stiffening member is mounted adjacent to the second conductive layer of the capacitor. A device receiving region is formed through the dielectric substrate, the conductive trace layer and the capacitor.

A further embodiment of the present invention provides a method of reducing impedance in an electronic package. The method includes forming an interconnect circuit having a conductive trace layer patterned to define a plurality of interconnect pads and a dielectric substrate mounted on a first side of the conductive trace layer. A capacitor is formed including a first conductive layer, a second conductive layer and a layer of dielectric material disposed between the first and the second conductive layers. A plurality of openings are formed through the first conductive layer and the layer of dielectric material of the capacitor to define a plurality of interconnect regions. The capacitor is mounted on the interconnect circuit with the first conductive layer of the capacitor adjacent to a second side of the conductive trace layer. The first conductive layer of the capacitor is electrically connected with a first set of the interconnect pads and the second conductive layer of the capacitor is electrically connected with a second set of the interconnect pads.

The following terms have the following meanings when used herein:

1. The term "large scale capacitor" refers to a capacitor that circumscribes a significant portion of the area of the conductive trace layer.
2. The term "thin film capacitor" refers to a capacitor including electrodes having a thickness of less than about 100 microns and a dielectric layer about 20 microns or less.
3. The term "interconnect circuit" refers to a circuit for routing power, ground and/or information signals of an electronic device to a next level of packaging in an electronic system or apparatus.
4. The term "interconnect inductance" refers to inductance associated with the type of interconnect structure and length of the interconnect structure between the interconnect circuit and an electronic device in an electronic package.
5. The term "interconnect region" refers to an opening formed through a first conductive layer and a dielectric layer of a capacitor. A plurality of electrical interconnects, such as electrical connections between solderball pads and a second conductive layer of the capacitor, can be made through an interconnect region.

DETAILED DESCRIPTION OF THE DRAWINGS

Figure 1:
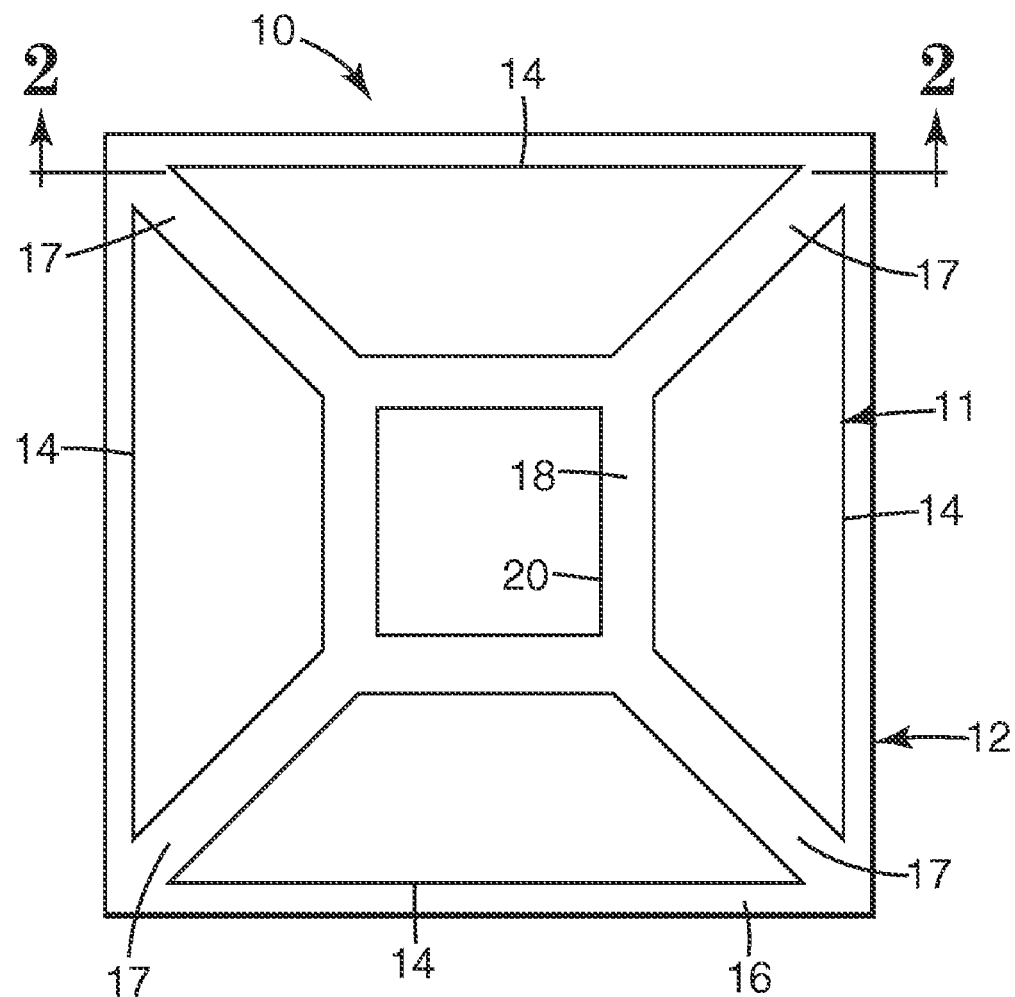
FIG. 1 is a plan view diagrammatically illustrating an embodiment of a thin-film, parallel plate type of capacitor.
Figure 2:
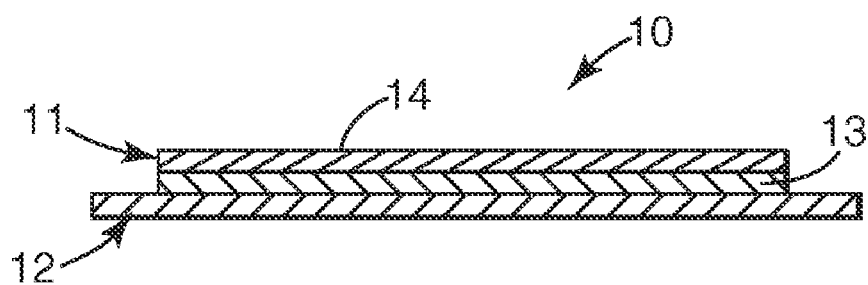
FIG. 2 is a cross-sectional view taken along the line 2-2 in FIG. 1.

An embodiment of a large scale capacitor 10, according to the present invention, is illustrated in FIGS. 1 and 2. As defined above, the capacitor 10 is preferably a thin-film, parallel-plate capacitor. The capacitor 10 includes a first conductive layer 11, a second conductive layer 12 and a dielectric layer 13, FIG. 2, disposed between the first and the second conductive layers 11, 12. The dielectric layer 13 has a thickness of from about 0.5 µm to about 30 µm.

The first conductive layer 11 and the dielectric layer 13 are patterned to define a plurality of first electrodes 14. The patterning of the first conductive layer 11 and the dielectric layer 13 defines a plurality of first interconnect regions 17 and a second interconnect region 18. In other embodiments, the first conductive layer 11 may be patterned such that each one of the first electrodes 14 are electrically connected to each adjacent first electrode 14 by a conductive strip formed between adjacent electrodes 14. The second conductive layer 12 is preferably non-patterned and defines a second electrode 16. A device receiving region 20 is formed through the first conductive layer 11, the second conductive layer 12 and the dielectric layer 13. Each one of the first interconnect regions 17 is positioned between two adjacent first electrodes 14 and the second interconnect region 18 extends around a perimeter of the device receiving region 20.

It is a key aspect of the present invention that the first conductive layer 11 and the dielectric layer 13 are patterned to permit access to the second electrode 16 and first electrodes 14 from a common side of the capacitor 10. By limiting the size and controlling the location of the patterned portions of the first electrodes 14, the reduction in the effective capacitance of the capacitor 10 can be minimized. The first conductive layer 11 and the dielectric layer 13 may be patterned using a known process such as etching or laser ablation. The device receiving region 20 may be formed by a known process such as punching, laser cutting or the like.

Figure 3:
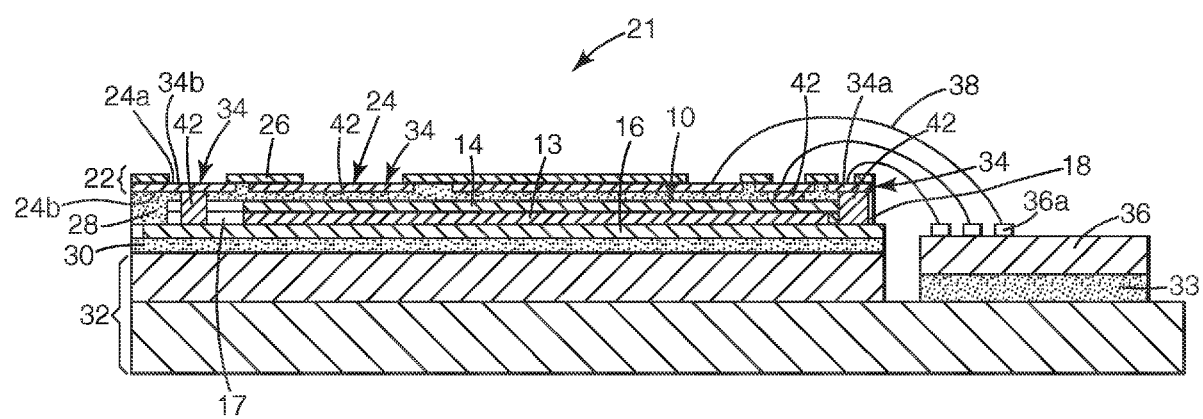
FIG. 3 is a cross-sectional view illustrating an embodiment of a package including an electronic device connected to a thin-film, parallel plate capacitor through a conductive trace layer of an interconnect circuit.

An embodiment of an electronic package 21, such as a tBGA cavity-down wire bond package, is illustrated in FIG. 3. The electronic package 21 provides a flexible interconnect circuit 22 including a conductive trace layer 24 having a dielectric substrate 26 mounted on a first side 24a of the conductive trace layer 24. A first adhesive layer 28 is used to attached the capacitor 10, discussed above, to a second side 24b of the conductive trace layer 24. The first adhesive layer 28 is made of an electrically insulating adhesive. A second adhesive layer 30 is used to attach a stiffening member 32 to the capacitor 10. A third adhesive layer 33 is used to attach an electronic device 36, such as a microprocessor, to the stiffening member 32. In the case where it is desirable to maintain the stiffening member 32 and the second electrode 16 at the same voltage, the second adhesive layer 30 may be made from an electrically conductive adhesive material. In the case where it is desirable to maintain the stiffening member 32 and the second electrode 16 at different voltages, the second adhesive layer 30 is made from a non-conductive adhesive material. The third adhesive layer 33 may be made of a conductive material to assist in preventing damage of the electronic device 36 by electrostatic discharge.

The conductive trace layer 24 of the flexible interconnect circuit 22 is typically patterned to include a plurality of traces 34 for routing power and signals through the flexible interconnect circuit 22. The electronic device 36 includes a plurality of wire bonding pads 36a. Each trace 34 includes a bonding pad 34a, such as a wire bond pad, and an interconnect pad 34b, such has a solderball pad. A wire 38 is connected between each bonding pad 34a and a corresponding one of the bonding pads 36a of the electronic device 36.

Each one of the first electrodes 14 and the second electrodes 16 are connected to a corresponding one of the traces 34 by a respective interconnect member 42, such as a solder plug. Each interconnect member 42 extends through the first adhesive layer 28 between a respective trace 34 and a corresponding one of the electrodes 14, 16 of the capacitor 10. Each interconnect member 42 that is connected between the second electrode 16 and the corresponding trace is positioned in the first or the second interconnect regions 17, 18. The patterned configuration of the capacitor 10 provides a short electrical path between the second electrode 16 and the corresponding trace or traces 34, reducing the impedance exhibited by the electronic package 21. It is preferred that each interconnect member 42 is made of a high melt temperature solder such as solder comprising approximately 90% Tin and approximately 10% Lead.

A suitable non-conductive adhesive for the first adhesive layer 28 and the second adhesive layer 30 has been found to be a polyimide-based adhesive film sold by DuPont under the tradename KJ. A suitable material for the dielectric substrate 26 has been found to be a polyimide film such as that sold by DuPont under the tradename KAPTON E. Various conductive adhesives are commercially available. Although the materials delineated above are suitable, it is contemplated that numerous other materials suitable for the various dielectric substrates and adhesive layers are commercially available.

Figure 4:
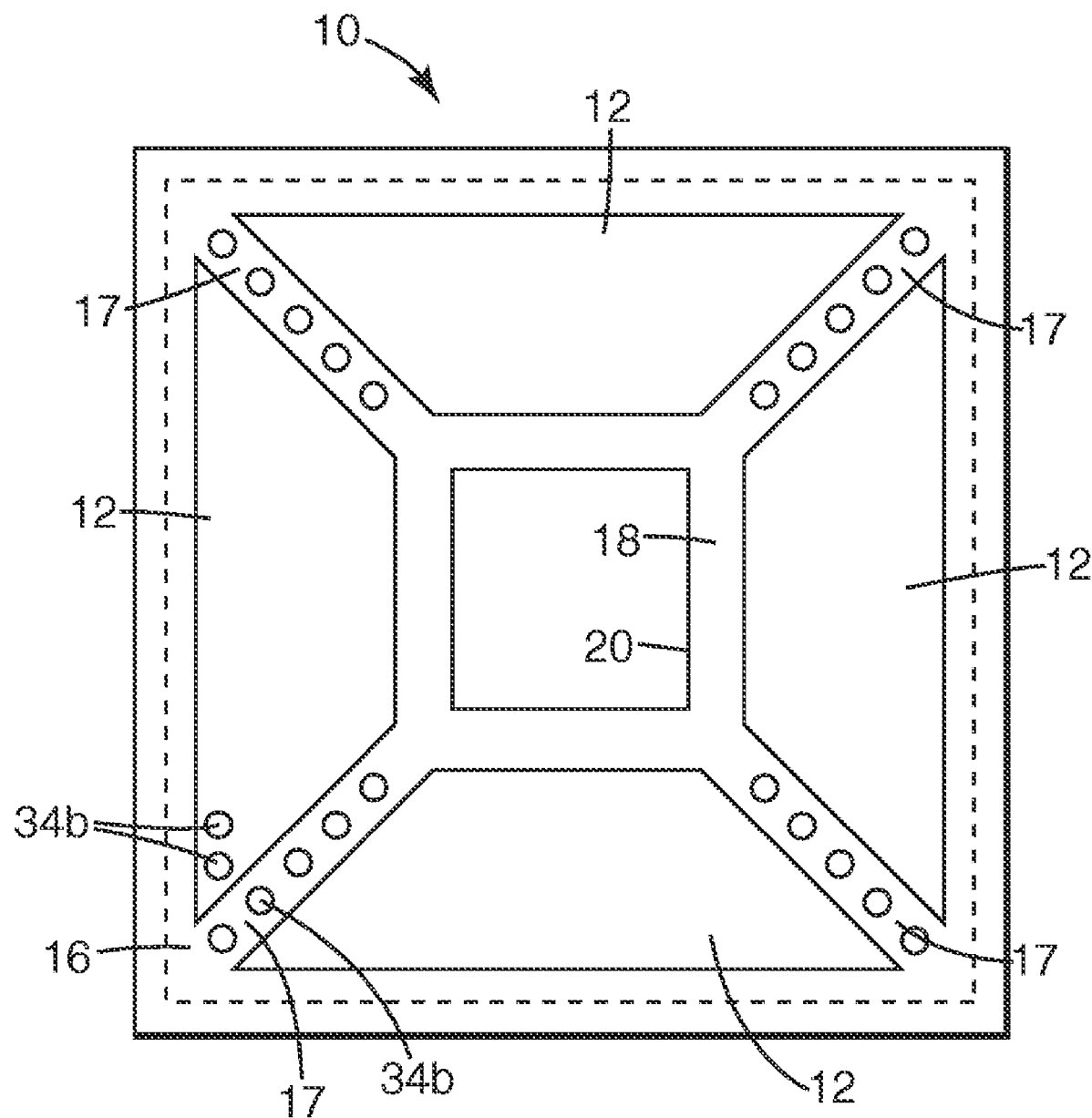
FIG. 4 is a plan view diagrammatically illustrating an embodiment of the solder ball assignments relative to the interconnect regions of a capacitor.

Referring now to FIGS. 3 and 4, a first set of the interconnect pads 34b is aligned with the first interconnect regions 17. A second set of the interconnect pads 34b is aligned with one of the first electrodes 14. The close proximity of the first electrodes 14 and the second electrode 16, with respect to the corresponding interconnect pads 34b, is preferred to provide a relatively short interconnect length, contributing to reduced inductance. The first and the second sets of the interconnect pads 34b are designated for routing reference voltages to the electronic device 36. A third set of the interconnect pads 34b, designated for routing of signals to and from the electronic device 36, is not limited to placement with respect to the electrodes 14, 16 or the interconnect regions 17, 18 of the capacitor 10.

Figure 5:
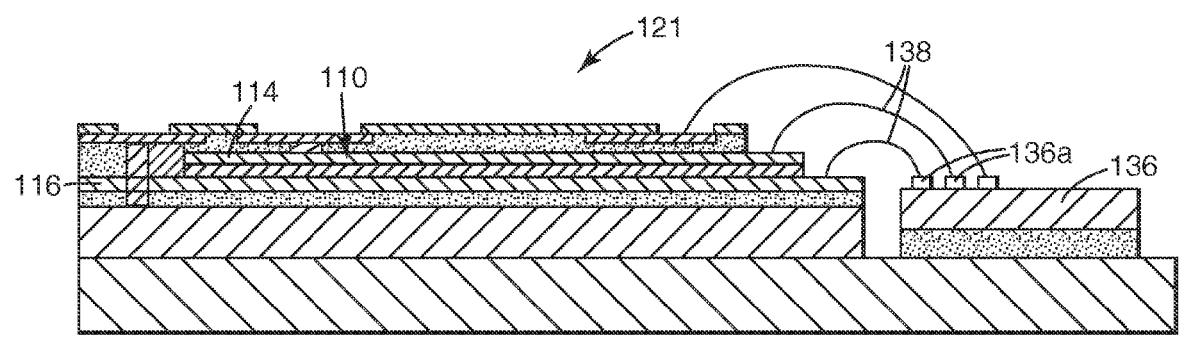
FIG. 5 is a cross-sectional view illustrating an embodiment of an electronic package including an electronic device electrically connected directly to a capacitor.

Another embodiment of an electronic package 121, including a capacitor 110, is illustrated in FIG. 5. The capacitor 110 includes a first electrode 114 and a second electrode 116. The electronic package 121 includes an electronic device 136 having a plurality of bonding pads 136a that are electrically connected directly to the first electrode 114 and to the second electrode 116 by a plurality of wires 138. The first electrode 114 is maintained at a different voltage from the second electrode 116. In this configuration, the first and the second electrodes 114, 116 serve as reference voltage planes for the electronic device 136.

Figure 6:
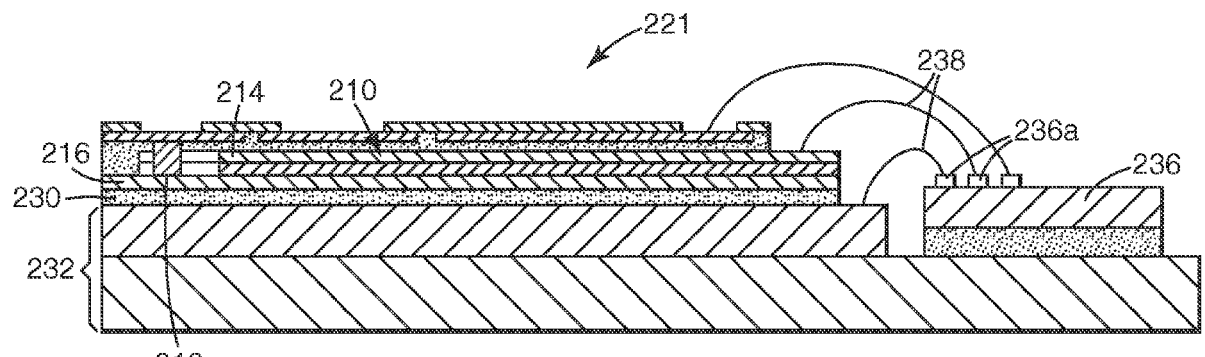
FIG. 6 is a cross-sectional view illustrating an embodiment of an electronic package including an electronic device electrically connected directly to a capacitor and to a stiffener.

A further embodiment of an electronic package 221 including a capacitor 210 is illustrated in FIG. 6. The capacitor 210 includes a first electrode 214 and a second electrode 216. In this embodiment, the second electrode 216 is electrically connected to stiffening member 232 by a conductive adhesive layer 230. The electronic package 221 includes an electronic device 236 having a plurality of bonding pads 236a that are electrically connected directly to the first electrode 214 and to the stiffening member 232 by a plurality of wires 238. The first electrode 214 is maintained at a different voltage from the second electrode 216 and the stiffening member 232. In this configuration, the first electrode 214 and the stiffening member 232 serve as reference voltage planes for the electronic device 236.

The capacitance of the capacitor needs to be matched to the frequency, voltage and current specifications of the electronic device attached to the capacitor. Furthermore, an electronic package according to the present invention must include a capacitor having a capacitance high enough to supply sufficient current to the electronic device. The capacitance of a capacitor is influenced by variables such as the overlapping area of the electrodes, the thickness of the dielectric material, and the dielectric constant of the dielectric material. These attributes can be tailored to provide a desired capacitance for a given electronic device and package construction.

Electronic packages constructed in accordance with the present invention exhibit highly controlled capacitive coupling. The highly controlled capacitive coupling permits the assignment of power and ground interconnects to be based on the patterning of the first electrode rather than other design requirements with only negligible loss of electrical performance.

In TBGA cavity-down electronic packages according to the present invention, the capacitor is positioned between the interconnect circuit and the stiffener. In this configuration, the electrodes and dielectric material of the capacitor are not breached by through-holes required for routing electrical interconnections from the electronic device to board level interconnect components. The elimination of these types of discontinuities in the electrodes and dielectric layer significantly increases the effective capacitance of the capacitor.

Electronic packages according to the present invention include several features that provide several advantages in end use applications. The effective area of the capacitor is maximized by patterning only one of the conductive layers. The capacitance is directly proportional to the common area of both electrodes such that maximizing the effective area of the capacitor contributes to maximizing the capacitance. The highly controlled capacitive coupling between the electrodes reduces the impedance of the power and ground distribution in the package. The return currents to and from the electronic device are able to travel on both of the conductive layers of the capacitor. The electrodes may be used for providing power distribution for the electronic package by serving as reference voltage planes. The power and ground inputs of the electronic device may be interconnected directly to the corresponding electrodes of the capacitor rather than through the trace layer of the interconnect circuit. An electronic package employing a capacitor having a construction disclosed herein and connected in a manner disclosed herein exhibits superior interconnect impedance characteristics, reducing noise in the package.

Detailed Description of Capacitor Fabrication Process

A copper foil, or other conductive substrate, which may have material present on its surface such as an organic anti-corrosion agent (for example, a benzotriazole derivative) and residual oils from the rolling process, preferably, has a thickness of less than about 100 microns. The copper foil is subjected to a surface treatment, for example, to ensure good adhesion between the dielectric layer and layers of copper foil. Removal can be effected by, for example, treating the foil with an argon-oxygen plasma, an air corona, or a wet chemical treatment can be used as is well understood in the art. Particulates adhering to both sides of the foil can be removed using, for example, an ultrasonic/vacuum web cleaning device commercially available from Web Systems Inc., under the trade designation "Ultracleaner". Preferably, the copper foil is not scratched, dented, or bent during this surface treatment step as such surface irregularities may cause coating problems and/or defects. Non-uniform coating may adversely affect the capacitance of the capacitor, and may result in short circuits between the conductive layers.

A blend of dielectric material may be prepared by providing a resin such as epoxy, optionally including dielectric or insulting particles such as barium titanate, and optionally including a catalyst for the epoxy. Absorbed water or residual materials on the particles; e.g., carbonates resulting from the manufacturing process can be removed from the surface of the particles before use by heating the particles in air at a particular temperature for a period of time, for example, 350° C. for 15 hours. After heating, the particles may be stored in a dessicator prior to use in the blend.

The blend of barium titanate particles and epoxy may be prepared by mixing together barium titanate, a solvent solution of epoxies, e.g. ketone, and a dispersing agent. Typically, a high shear rotor-stator mixer (6000 rpm) with a water/ice bath is used. Conventional ball-milling is another exemplary method. The blend is allowed to sit undisturbed allowing agglomerates to settle to the bottom of the container. The settling is allowed to occur for about 12 hours or more. Alternatively, the blend can be filtered through a coarse filter, for example, which has a mesh size about ten times the mesh size used in the final filtration step. As a final filtration step, the blend is then filtered, for example, through a stainless steel mesh filter or equivalent having a mesh size of from about 2 micrometers (μm) to about 5 μm. The filtered blend is analyzed for percent solids and barium titanate/epoxy ratio. The desired composition is obtained by adding additional filtered solvent and/or epoxy as necessary. The blend may be coated in a solvent system or solvent may be omitted if the organic binder is a liquid with sufficiently low viscosity to enable coating.

The blend may contain additives such as a dispersant, preferably an anionic dispersant when an electrically insulating layer is desired, and solvents. Examples of dispersants include a copolymer of polyester and polyamine commercially available from ICI Americas, under the trade designation "Hypermeer PS3". Examples of solvents include methyl ethyl ketone and methyl isobutyl ketone, both of which are commercially available from Aldrich Chemical, Milwaukee, Wis. In the preferred system, other additives are not required however, additional components such as agents to change viscosity or to produce a level coating can be used.

A catalyst or curing agent may be added to the blend. If a catalyst or curing agent is used, the catalyst or curing agent can be added before the coating step. Preferably, the catalyst or curing agent is added just before the coating step.

Useful catalysts include amines and imidazoles. If particles having a basic surface, i.e., having a pH of greater than 7, are not present, then exemplary catalysts can include those producing acidic species, i.e., having a pH of less than 7, such as sulfonium salts. A commercially available catalyst is 2,4,6-tris (dimethylaminomethyl) phenol commercially available from Aldrich Chemical, Milwaukee, Wis. Typically, a catalyst is used in an amount ranging from about 0.5% to about 8% by weight, preferably 0.5% to 1.5%, based on the weight of resin is preferably 0.5% to 1%.

Exemplary curing agents include polyamines, polyamides, polyphenols and derivatives thereof. A commercially available curing agent is 1,3-phenylenediamine, commercially available from E. I. DuPont de Nemours Company, Wilmington, Del. Typically, a curing agent is used in an amount ranging from about 10% to about 100% by weight, preferably from about 10% to about 50% by weight, based on the weight of resin.

The cleaned copper foil is coated with the blend using any suitable method, for example, a gravure coater to form a coated substrate. Preferably, the coating step is performed in a cleanroom to minimize contamination. The dry thickness depends on the percent solids in the blend, the relative speeds of the gravure roll and the coating substrate, and on the cell volume of the gravure used. Typically, to achieve a dry thickness in the range of from about 0.5 μm to about 2 μm, the percent solids are in the range of from about 20% to about 60% by weight. The coating is dried to a tack-free state in the oven of the coater at an average temperature of less than about 100° C. Preferably the coating is dried in stages, starting with a temperature of about 30° C. and ending with a temperature of about 100° C., and then wound onto a roll. Higher final drying temperatures, e.g., up to about 200° C. can be used, but are not required. Generally, very little cross-linking occurs during the drying step; its purpose is primarily to remove as much solvent as possible.

Retained solvent may lead to blocking (i.e., unwanted interlayer adhesion) when the coating is stored on a roll and to poor adhesion. Once the blend is dried, the coating includes the conductive substrate with a dielectric layer formed thereon.

Techniques to avoid defects include in-line filtration and deaeration of the coating mixture. In addition, it is preferable, if a resin requiring curing is used, that at least one of the electrically insulating or electrical conducting layers is partially cured, preferably in air, before laminating two substrates coated with an electrically insulating layer. In particular, adhesion of the substrate may be improved by heat treating the coating before lamination. The time for heat treatment is preferably short, generally less than about 10 minutes, particularly at higher temperatures.

Lamination is preferably carried out using two of the coated substrates described above. One of the coated substrates may go through an oven before reaching the laminator, for example, at a temperature ranging from about 150° C. to about 180° C. for from about 2 minutes to about 10 minutes. This preliminary heating step can be done on one or both of the coated substrates. Preferably, the electrically insulating layer should not touch anything during lamination and lamination should be done in a cleanroom.

To make a capacitor according to the present invention, the coated substrates are laminated, dielectric layer to dielectric layer, using a laminator with two nip rollers heated to a temperature ranging from about 150° C. to about 200° C., preferably about 150° C. Suitable air pressure is supplied to the laminator rolls, preferably at a pressure ranging from 34 kPa to 280 kPa (5 psi to 40 psi), preferably 100 kPa (15 psi). The roller speed can be set at any suitable value and preferably ranges from about 12 to about 36 inches/minute (0.5 to 1.5 cm/second), more preferably 0.64 cm/second (15 inches/minute). This process can be conducted in a batch mode as well.

The laminated substrate can be cut into sheets of the desired length or wound onto a suitable core. Once lamination is complete, the preferred cleanroom facilities are not longer required.

When the resin requires curing, the laminated material is then cured. Exemplary curing temperatures include temperatures ranging from about 140° C. to about 200° C., preferably from about 140° C. to about 170° C., and exemplary curing times include a period ranging from about 60 minutes to about 150 minutes, preferably from about 60 minutes to about 100 minutes.

Adhesion of the dielectric layer to the conductive substrate may be enhanced if the conductive substrate is sufficiently soft at the time of coating or becomes soft during lamination and/or cure; i.e., the copper foil is annealed before coating or becomes annealed during subsequent processing. Annealing may be accomplished by heating the conductive substrate before the coating step, or as a result of the curing or drying step, if the substrate anneal temperature is at or lower than the cure temperature of the resin. It is preferred to use a conductive substrate with an anneal temperature below the temperature at which curing or drying and lamination occur. Annealing conditions will vary depending on the conductive substrate used. Preferably, in the case of copper, at either of these stages in the process, the conductive substrate obtains a Vickers hardness, using a 10 g load, of less than about 75 kg/mm$^2$. A preferred temperature range for copper to achieve this hardness ranges from about 100° C. to about 180° C., more preferably from about 120° C. to about 160° C.

Capacitors according to the present invention are excised from the laminated substrate using any suitable process such as punching or laser cutting. Optionally, one or both of the conductive layers and/or the dielectric layer may be patterned to form discrete electrodes and interconnect regions. Any suitable patterning technique known in the art may be employed to pattern the various layers of the capacitor. For example, patterning of the conductive layers and the dielectric layer may be performed by photolithography and/or by laser ablation as is well known in the art.

Photolithography may be performed by applying a photoresist to one or both of the conductive layers, which is then exposed and developed to form a pattern of concealed and exposed areas on the corresponding layers. If the capacitor is then exposed to an etching solution, selected areas and layers of the capacitor can be removed. A stripping agent such as potassium hydroxide is then employed to remove the remaining areas of photoresist. This process allows areas and layers of the capacitor to be removed that are not desired.

Laser ablation may be performed by using a laser to selectively thermally remove material, such as the dielectric layer, from the capacitor. Photolithography and laser ablation may be used in combination.

The electrical performance exhibited by circuit assemblies and electronic packages according to the present invention is greatly improved over previous constructions. Complex patterning of the conductive trace layers and the dielectric layer of the capacitor is not required for permitting the interconnect pads of the interconnect circuit to be electrically connected with the conductive layers of the capacitor. The signal traces in these packages are kept close to the electrodes such that the inductance of the signal traces is controlled. Furthermore, the present invention also provides a relatively high capacitance between adjacent electrodes of the capacitor and a relatively low capacitance between the signal traces and the adjacent electrodes of the capacitor. The capacitance and inductance characteristics result in relatively low impedance, allowing the return current in electronic packages according to the present invention to be effectively passed on either of the conductive layers of the capacitor.

Accordingly, it is appropriate that the appended claims be construed broadly and in a manner consistent with the scope of the embodiments and descriptions disclosed herein.

What is claimed is:

1. An electronic package, comprising:
   a conductive trace layer having a first side and a second side, the conductive trace layer being patterned to define a plurality of interconnect pads;
   a dielectric substrate mounted on the first side of the conductive trace layer;
   a capacitor including a first conductive layer, a second conductive layer and a layer of dielectric material disposed between the first and the second conductive layers, the first conductive layer mounted adjacent to the second side of the conductive trace layer;
   a plurality of interconnect regions extending through the first conductive layer and the dielectric material layer of the capacitor;
   an interconnect member connected between each of the conductive layers of the capacitor and a corresponding set of the interconnect pads, the first conductive layer of the capacitor being electrically connected to a first set of the interconnect pads and the second conductive layer of the capacitor being electrically connected to a second set of the interconnect pads, the interconnect members corresponding to the second set of interconnect pads extending through one of the interconnect regions;

an electrically conductive stiffening member mounted adjacent to the second conductive layer of the capacitor; and a device receiving region extending through the dielectric substrate, the conductive trace layer and the capacitor, and further comprising an electronic device mounted in the device receiving region on the stiffening member;

wherein the electronic device includes a plurality of bonding pads, and further comprises a first wire electrically connected between a first one of the bonding pads and the first conductive layer of the capacitor, and a second wire electrically connected between a second one of the bonding pads and the second conductive layer of the capacitor.

2. An electronic package, comprising:

a conductive trace layer having a first side and a second side, the conductive trace layer being patterned to define a plurality of interconnect pads;

a dielectric substrate mounted on the first side of the conductive trace layer;

a capacitor including a first conductive layer, a second conductive layer and a layer of dielectric material disposed between the first and the second conductive layers, the first conductive layer mounted adjacent to the second side of the conductive trace layer;

a plurality of interconnect regions extending through the first conductive layer and the dielectric material layer of the capacitor;

an interconnect member connected between each of the conductive layers of the capacitor and a corresponding set of the interconnect pads, the first conductive layer of the capacitor being electrically connected to a first set of the interconnect pads and the second conductive layer of the capacitor being electrically connected to a second set of the interconnect pads, the interconnect members corresponding to the second set of interconnect pads extending through one of the interconnect regions;

an electrically conductive stiffening member mounted adjacent to the second conductive layer of the capacitor; and a device receiving region extending through the dielectric substrate, the conductive trace layer and the capacitor, and further comprising an electronic device mounted in the device receiving region on the stiffening member;

wherein the electronic device includes a plurality of bonding pads, and further comprises a first wire electrically connected between a first one of the bonding pads and the first conductive layer of the capacitor, and a second wire electrically connected between a second one of the bonding pads and the stiffening member.

3. The electronic package of claim 2 further comprising an electrically conductive adhesive disposed between the second conductive layer of the capacitor and the stiffening member.

4. An electronic package, comprising:

a conductive trace layer having a first side and a second side, the conductive trace layer being patterned to define a plurality of interconnect pads;

a flexible dielectric substrate mounted on the first side of the conductive trace layer;

a flexible capacitor including a first conductive layer, a second conductive layer and a layer of dielectric material disposed between the first and the second conductive layers, the first conductive layer mounted adjacent to the second side of the conductive trace layer;

a plurality of interconnect regions extending through the first conductive layer and the dielectric material layer of the capacitor; and an interconnect member connected between each one of the conductive layers of the capacitor and a corresponding set of the interconnect pads, the first conductive layer of the capacitor being electrically connected to a first set of the interconnect pads and the second conductive layer of the capacitor being electrically connected to a second set of the interconnect pads, the interconnect members corresponding to the second set of interconnect pads extending through one of the interconnect regions;

an aperture extending through the dielectric substrate adjacent to each one of the interconnect pads;

a stiffening member mounted adjacent to the second conductive layer of the capacitor; and a device receiving region formed through the dielectric substrate, the conductive trace layer and the capacitor.

* * * * *